United States Patent [19]

Schultz et al.

[11] Patent Number: 4,950,644

[45] Date of Patent: Aug. 21, 1990

[54] METHOD FOR THE EPITAXIAL PREPARATION OF A LAYER OF A METAL-OXIDE SUPERCONDUCTING MATERIAL WITH A HIGH TRANSITION TEMPERATURE

[75] Inventors: Ludwig Schultz, Bubenreuth; Joachim Wecker, Erlangen, both of Fed. Rep. of Germany

[73] Assignee: Siemens Aktiengesellschaft, Berlin & Munich, Fed. Rep. of Germany

[21] Appl. No.: 302,823

[22] Filed: Jan. 26, 1989

[30] Foreign Application Priority Data

Jan. 27, 1988 [DE] Fed. Rep. of Germany ....... 3802348
Oct. 13, 1988 [DE] Fed. Rep. of Germany ....... 3834963

[51] Int. Cl.$^5$ .......................... H01L 39/12; B22F 9/04
[52] U.S. Cl. ......................................... 505/1; 148/903; 156/610; 420/901; 427/62; 505/729
[58] Field of Search ....................... 148/903; 156/610; 427/62; 505/729, 1; 420/901

[56] References Cited

U.S. PATENT DOCUMENTS

4,046,618  9/1977  Chaudhari et al. ................. 156/603

FOREIGN PATENT DOCUMENTS

0265886  5/1988  European Pat. Off. ................ 505/1
0288641 11/1988  European Pat. Off. ............ 420/901
2070327  9/1981  United Kingdom .

OTHER PUBLICATIONS

Cody et al., Appl. Phys. Letts., 52, (May 1988), 1531.
Jin et al., Phys. Rev. 37B, (May 1988), 7850.
Jin et al., Appl. Phys. Letts. 52, (Jun. 1988), 2074.
Kwok et al. in High Tc Superconductors, eds.
Brodsky et al., MRS. Symp. Proc. #99, 1987 (Nov.), 735.
Washburn et al., MRS. Symp. Prc. #99, Ibid, Nov. 1987, p. 699.
Roas et al., Appl. Phys. Letts. 54, (1989), 1051.
Koren et al., Appl. Phys. Letts. 54, (1989), 1054.
Lathrop et al., Appl. Phys. Letts. 51, (Nov. 1987), 1554.
Burton et al., in AIP Conf. Proc. #165, Nov. 1987, eds. Harper et al., p. 166.
Liberts et al., Appl. Phys. 46A, (Aug. 1988), 331.
De Santolo et al. in AIP Conf. Proc. 190 165, Nov. 1987, eds. Harper et al., p. 174.
Phys. Rev. Letters, vol. 58, No. 25, 6/22/87, pp. 2684–2686.
Europhys. Lett., vol. 3, No. 12, 6/15/87, pp. 1301–1307.
Izvestija Akedmii Nauk SSSR, Ser. Fiz., vol. 39, No. 5, May 1975, pp. 1080–1083.
"Superconducting Thin Film of Perowskite Sypercon-ductors by Electron-Beam Deposition" to MRS Symposium on High-Temperature Superconductors, Anaheim, CA, Apr. 23 and 24, 1987, by Hammond et al.
Canadian Journal of Physics, vol. 63, 1985, pp. 881–885.
Eaton Corp., Danvers MASS: ROA-400 Rapid Thermal Processor; "A Short Course in Rapid Thermal Processing".
Peak Systems Inc., Fremont, CA "ALP 6000 Rapid Therma Processors"; Appl. Phys. Lett., vol. 51, No. 21, 11/23/87, pp. 1753–1755.
Japanese Journal of Appl. Physics, vol. 26, No. 7, Jul. 1987, pp. L1221–L1222.

*Primary Examiner*—Upendra Roy
*Attorney, Agent, or Firm*—Kenyon & Kenyon

[57] ABSTRACT

With the method, a layer of a superconductor material with a high transition temperature on the basis of a material system containing metallic components and oxygen is to be prepared. To this end, a layer of metal-oxide preliminary product of the components of the system with a structure still having faults with respect to the superconducting metal oxide phase is first applied to a predetermined substrate with an ordered structure and the desired superconducting metal oxide phase is epitaxially formed subsequently, using a heat treatment and while oxygen is being supplied. It should be possible to carry out the heat treatment such that application in semiconductor technology is possible. For the development of the desired superconducting metal oxide phase, thermal pulses of short duration, for instance, of an optical radiation source, are provided where at least at the beginning of this process step, the boundary surface between the preliminary product and the substrate is heated such that a temperature gradient of at least 10° K. per μm measured over the thickness of the layer is obtained.

20 Claims, 1 Drawing Sheet

METHOD FOR THE EPITAXIAL PREPARATION OF A LAYER OF A METAL-OXIDE SUPERCONDUCTING MATERIAL WITH A HIGH TRANSITION TEMPERATURE

BACKGROUND OF THE INVENTION

The present invention relates to a method for the preparation of a layer of a superconducting material with a high transition temperature on the basis of a material system containing metallic components and oxygen. With this method, a layer of a metal oxide preliminary product of the components of the system with a structure which still contains faults with respect to the superconducting metal oxide phase to be developed is first applied to a predetermined substrate with an ordered structure, and subsequently the desired superconducting metal oxide phase is formed epitaxially, using a heat treatment in oxygen. Such a method can be found, for instance, in "Physical Review Letters", Vol. 58, No. 25, June 22, 1987, pages 2684 to 2686.

Films and thin layers of superconducting metal oxide compounds with a high transition temperature $T_c$ of more than 77° K. are generally known. The superconducting metal oxide compounds which contain several metallic components and oxygen can have here in particular a composition of the type Me1—Me2—Cu—O (Me1=rare earths including yttrium; Me2=earth alkali metals). Films of such material are frequently produced by special vapor deposition or sputtering processes.

Here, a polycrystalline or amorphous preliminary product of the components of the chosen material system is first deposited on a suitable substrate. This preliminary product is subsequently converted into the material with a desired superconducting phase by an annealing treatment which must generally be carried out while oxygen is being supplied. The superconducting metal oxide phases which can be obtained in this manner and the structures of which are similar to that of a perowskite have, in the case of $YBa_2CU_3O_{7-x}$ with $0 < x < 0.5$, an orthorhombic structure (see, for instance, "Europhysics Letters", Vol. 3, No. 12, June 15, 1987, pages 1301 to 1307). Since the materials exhibiting these superconducting phases are similar to oxide ceramics, the corresponding high-$T_c$ superconductors are frequently also designated as oxide-ceramic superconductors.

In addition, it is known from the above-cited publication "Phys. Rev. Lett." to produce monocrystalline films of the system $YBa_2CU_3O_{7-x}$ on a monocrystalline $SrTiO_3$ substrate by means of epitaxy. To this end the three metallic components of the system are first vapor-deposited on the substrate which exhibits an ordered structure and is at a temperature of about 400° C., from separate evaporation sources in an oxygen atmosphere. The preliminary product obtained in this manner, however, still has a fault structure with respect to the desired superconducting high-$T_3$ phase. By means of a subsequent heat treatment at a high temperature of about 800° to 900° C. and while oxygen is being supplied, epitaxially grown monocrystalline or at least heavily textured film layers with the desired superconducting high-$T_c$ phase are obtained. Films produced in this manner exhibit a high critical current density $j_c$ of more than $10^5 A/cm^2$ at 77°K.

This epitaxy, however, is a necessary condition for reaching such high critical current densities which thereby could also open up wide areas of application for such superconducting films. Thus, for instance, corresponding metallizing layers on semiconducting components are conceivable. The mentioned high-temperature process for developing the desired superconducting high-$T_c$ phase is generally not compatible with the customary process steps for fabricating semiconductor circuits. In addition, the epitaxy proceeding in the high-temperature process is difficult to control since fault-oriented grains are frequently generated which have an adverse effect on the superconducting properties and particularly on the critical current density.

SUMMARY OF THE INVENTION

It is therefore an object of the present invention to develop the known method of the type mentioned above such that the epitaxy process proceeds controllably. It should further be possible to produce layers with high current-carrying capacity which do not require an annealing step in the known manner and can therefore avoid damage to semiconducting components which may be connected to such layers.

The above and other objects of the invention are achieved by a method for the preparation of the layer of a superconducting material with a high transition temperature on the basis of a material system containing metallic components and oxygen. With this method, a layer of a metal-oxide preliminary product of the components of the system with a structure which still contains faults with respect to the superconducting metal-oxide phase to be developed is first applied to a predetermined substrate with an ordered structure, and subsequently the desired superconducting metal oxide phase is formed epitaxially, using a heat treatment in oxygen, characterized by the feature that, for an at least partial formation of the desired superconducting metal oxide phase, thermal pulses (TP) of short duration are provided, where at least at the beginning of this process step, the boundary surface between the preliminary product and the substrate is heated so that a temperature gradient ($\Delta T/\Delta d$), to be measured over the thickness (d) of the layer of at least 10 K. per $\mu$ is obtained.

The invention starts with the insight that at the boundary surface between the preliminary product and the substrate, a monocrystalline or at least heavily textured film can be produced by heterogeneous seed formation. The specific problem of heterogeneous seed formation is solved by the provision that the solid state reaction proceeding after the deposition of the preliminary product takes place in a steep temperature gradient. Once the necessary seeds are formed at the boundary surface, they can continue to grow through the entire layer also at temperatures substantially lower than with the known method. Thus, the advantages connected with the embodiment of the method according to the invention are in particular that here, the heat treatment remains largely confined to the boundary surface between the substrate and the preliminary product. An annealing treatment as in the known method is therefore not necessary. Thereby, it is possible to use such layers particularly in semiconductor technology.

BRIEF DESCRIPTION OF THE DRAWINGS

The invention will be described in greater detail in the following detailed description with reference to the drawings, in which.

DETAILED DESCRIPTION

Figure 1:
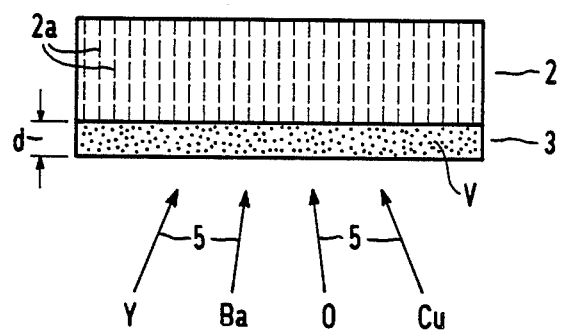
FIGS. 1 and 2 show individual steps for carrying out the method according to the invention illustrated as parts of such a layer build-up.

With the method according to the invention, at least one layer or at least one film of a known superconducting high-$T_c$ material can be produced on a predetermined substrate. The composition of superconducting materials suitable for this purpose is based here on a material system containing metallic components and oxygen. A specific material system of the type Me1—Me2—Cu—0 is chosen here as an embodiment. The method according to the invention is not limited, however, to this specific material system; i.e., other multi-component high-$T_c$ superconducting materials can be used just as well which cannot be ascribed to this specific material system, contain at least partially other and/or additional metallic components and oxygen, and can be kept in the superconducting operating condition above 77° K. Examples for this would be the material systems Bi-Sr-Ca-Cu-0 and Tl-Ba-Ca-Cu-0.

The layer which is to be produced according to the invention and the material of which, according to the chosen embodiment, has the composition Me1—Me2—Cu—0 should advantageously have a thickness of less than 10 $\mu$ and preferably less than 1 $\mu$ and have a current-carrying capacity in the order of magnitude of at least $10^4 A/cm^2$ at temperatures near the transition temperature $T_c$ of the material. If desired, however, also greater layer thicknesses of up to about 100 $\mu$ with the desired high-$T_c$ phase can be produced with the method according to the invention. As starting materials of the layer, Me1 can be chosen from the group of the rare earth materials such as Y or La and Me2 the group of earth alkali metals such as Sr or Ba. Besides Y or La, materials suitable for Me1 are generally known. The corresponding metallic components of the system Me1—Me2—Cu—0 should contain at least one (chemical) element from the mentioned groups or consist of this at least one element. I.e., Me1 and Me2 are preferably present in elementary form. Optionally, however, also alloys or compounds or other compositions of these metals with substitution materials are suitable as starting material; i.e., at least one of the mentioned elements can be substituted partially in a manner known per se by another element. Thus, for instance, the metallic components Me1 and Me2 can be substituted partially by another metal of the group of the metals provided for these components. Also the copper or the oxygen of the system can be substitued partially, for instance, by F. The materials to be chosen for the substrate are in particular those which have a perowskite-like structure, where their unit cells have dimensions which amount approximately to one or several times the corresponding dimensions of the axes of the structures of the superconducting high-$T_c$ materials grown on them. For this reason, a monocrystalline $SrTiO_3$ or (Ba, Sr) $TiO_3$ substrate is particularly advantageous in the case of $YBa_2Cu_3O_{7-x}$. Substrates textured accordingly are generally known (see, for instance, "Izvestija Akademii Nauk SSSR", Ser. Fiz., Vol. 39, No. 5, May 1975, pages 1080 to 083).

Figure 2:
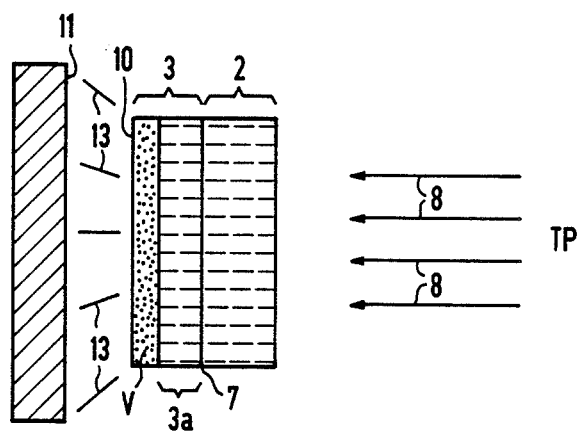

A corresponding concrete embodiment will be based, according to the steps schematically shown in FIGS. 1 and 2, on the preparation of a layer of a superconducting material with the known composition $YBa_2Cu_3O_{7-x}$ with an orthorhombic structure. This layer is to be developed on a predetermined substrate 2 with an ordered structure. The substrate is in particular monocrystalline $SrTiO_3$. In the figure, the corresponding texture of the substrate is indicated by dashed lines 2a.

On this substrate 2 which in general is optically transparent, a thin layer 3 of Y—Ba—Cu—0 with a still random structure is first deposited in a manner known per se. For this purpose, the metallic components Y, Ba, Cu of the material system can be applied in a PVD (Physical Vapor Deposition) process while simultaneously supplying oxygen, up to a maximum layer thickness d of less than 100 $\mu$, advantageously below 10 $\mu$ and preferably less than 1 $\mu$. One starts here, for instance, with targets of the three high-purity metallic components of the system. As is to be indicated in FIG. 1 by lines 5 with arrows, the material of these three metallic targets is then deposited simultaneously, for instance, by means of an RF-aided laser vapor deposition setup, together with oxygen gas or by an oxygen ion stream on the substrate 2. The substrate can be kept here advantageously at a relatively low temperature. Thus, suitable temperatures are, for instance, between 400° C. and room temperature. Such deposition systems are generally known. The individual process parameters for the deposition process such as in particular the pressure and the deposition rate, are set here so that the layer 3 grows gradually on the substrate 2 up to the mentioned layer thickness d. At the end of the deposition process there is present a still random Y—Ba—Cu—0 preliminary product V of the superconducting material to be produced which still has structural faults with respect to the desired orthorhombic high-$T_c$ phases. The preliminary product V is generally amorphous or polycrystalline.

Deviating from the described reactive RF-aided laser evaporation for depositing the preliminary product V, also other PVD processes such as sputtering, for instance, by means of a magnetron or vapor deposition by means of three separate electron beam sources while at the same time supplying oxygen as gas or as a ion stream are possible (see, for instance, the preprint of the contribution by R. H. Hammond et al with the title: "Superconducting Thin Film of Perowskite Superconductors by Electron-Beam Deposition" to "MRS Symposium on High-Temperature Superconductors, Anaheim, Calif., Apr. 23. and 24, 1987",)

Similarly, also chemical processes such as CVD (Chemical Vapor Deposition) are suitable instead of the physical processes for depositing the layer 3 of the still random preliminary product V.

According to the detail of the layer to be produced shown in FIG. 2, directional crystallization is caused to form the desired orthorhombic phase with the composition $YBa_2Cu_3O_{7-x}$ in the still random preliminary product V from its boundary surface with the substrate 2. To this end, the required solid-state reaction in a steep temperature gradient $\Delta T/\Delta d$ of at least 10° C. per $\mu$ (or 10 K per $\mu$) and preferably of at least 50 K/$\mu$ to be measured over the layer thickness d is to take place. This temperature gradient is generated by heating the entire substrate 2 or at least the boundary surface 7 developed between the substrate and the layer 3 of the preliminary product V by means of thermal pulses TP of short duration of a suitable optical source. Methods and apparatus suitable for this purpose are generally known particularly from semiconductor technology (see, for instance, "Canadian Journal of Physics", Vol.

63, 1985, pages 881 to 885; Eaton Corporation, Danvers, Mass.: "ROA 400 Rapid Thermal Processor" as well as the corresponding publication "A Short Course in Rapid Thermal Processing," Peak Systems Inc., Fremont, Calif., "ALP 6000 Rapid Thermal Processors"). Accordingly, the optically transparent substrate is heated from the rear by means of a so-called "light flasher", for instance, an Xe lamp not shown in the figures in the case of a preliminary product V which, as assumed in FIG. 2, is optically non-transparent after the deposition. The light rays of this lamp are indicated in the figure by lines 8 with arrows. In addition, the heat is removed by radiation to the parallel cooled surface 11, advantageously at the free surface 10 of the layer 3 which is opposite the irradiation side with the thermal pulses TP. The temperature of the surface 10 can thus be held at a temperature which is at least 300° C. lower than the temperature generated at the boundary surface 7 by the thermal pulses and thereby also guarantees the temperature gradient $\Delta T/\Delta d$ in the order of magnitude mentioned. In FIG. 2, the heat radiation onto the surface is indicated by lines 13 and the direction of change of the temperature gradient $\Delta T/\Delta d$ is indicated by an arrow 14.

With this formation of such a temperature gradient in the mentioned order of magnitude, directional crystallization can be ensured by rear irradiation. In accordance with FIG. 2, it is assumed that such crystallization, starting from the boundary surface 7, has already taken place in a larger subarea 3a of the layer 3 and, upon further action by the thermal pulses TP, propagates more and more in the direction toward the free surface 10 of the layer 3.

In some cases it may even be possible to fan up the desired crystallization only initially with the thermal pulses in a subarea of the preliminary product facing the substream. After such heterogeneous seed formation, the further use of the "light flasher" can then even be dispensed with and further spreading of the crystallized region can be caused by a normal heat treatment of the entire coated substrate, for instance, in the oven. Temperatures suitable therefor are generally between about 500° C. and 700° C. Advantageously, the heat treatment is carried out in an oxygen atmosphere.

Figure 3:
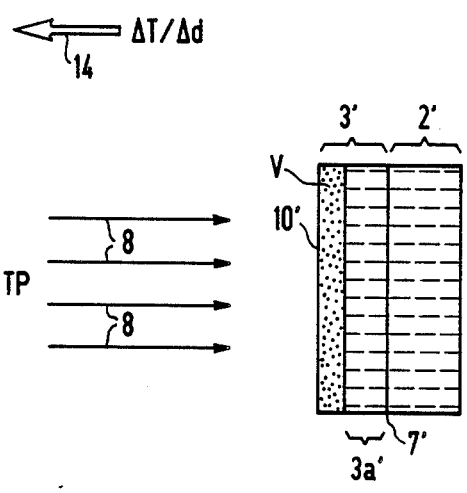
FIG. 3 shows a further embodiment for carrying out the method according to the invention in a similar view. Corresponding parts are provided in the figures with the same reference symbols.

With the deposition of a metal-oxide layer of the preliminary product, an optically transparent film is frequently generated. In this case, this film can also be exposed to the thermal pulses TP on one side. Such a situation is the basis of the detail of a coated substrate 2' schematically shown in FIG. 3. The light is then absorbed first in the underlying substrate 2'. To this end, the substrate should be optically non-transparent. This can be achieved, for instance, for the intrinsically transparent monocrystalline $SrTiO_3$, by a high-vacuum anneal prior to the deposition process of the preliminary product. Also, with this type of irradiation a pronounced temperature gradient $\Delta T/\Delta d$ of at least 10° C. per $\mu$ layer thickness is likewise generated in the layer 3' deposited, of a preliminary product V'. By heating the substrate, the tetragonal $YBa_2Cu_3O_{6.5+x}$ phase is generated at the boundary surface 7' between the substrate and the preliminary product, which is no longer transparent but light-absorbing. Thus, the absorption zone is shifted upon further irradiation with the light flasher through the entire film, whereby again a directional growth of the crystallized region 3a' from the boundary surface 7' to the free surface 10' of the layer 3' takes place.

By the method according to the invention, it is further possible to carry out the directional crystallization caused by means of the thermal pulses TP in the structurally still random preliminary product in an oxygen atmosphere in a manner known per se. Optionally a post-anneal can be performed, after the crystallization described with the aid of the figures, in order to still further improve the oxygen concentration in the metal oxide phase obtained. Temperatures suitable for this purpose are approximately 500° C.

According to the embodiment shown, it was assumed that the heating of the preliminary product V and V', respectively, is to take place only after the deposition of the respective layers 3 or 3' has been completed. However, it is also possible to have the heating begin already during the deposition process. Thereby, it may be possible to further aid the epitaxial growth of the desired superconducting metal oxide phase.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. A method for the preparation of a layer of a superconducting material with a high transition temperature on the basis of a material system containing metallic components and oxygen, comprising applying a layer of a predetermined thickness of a metal-oxide precursor alloy of the components of the system with a structure which still contains faults with respect to the superconducting metal-oxide phase to be developed to a predetermined substrate with an ordered structure, and subsequently forming the desired superconducting metal oxide phase epitaxially, using a heat treatment in oxygen, further comprising, for an at least partial formation of the desired superconducting metal oxide phase, providing thermal pulses of short duration, where at least at the beginning of said step of providing, a boundary surface between the precursor alloy layer and the substrate is heated by said thermal pulses so that a temperature gradient descending from the boundary surface to a free surface of the layer and measured over the thickness of the layer of at least 10° K. per $\mu$ is obtained.

2. The method recited in claim 1, wherein a temperature gradient of at least 50 K/$\mu$ is formed.

3. The method recited in claim 1, further comprising generating the thermal pulses by means of an optical radiation source.

4. The method recited in claim 1, wherein a material is chosen for the substrate having a unit cell which has dimensions which are matched to the corresponding dimensions of the unit cell of the crystals of the superconducting metal oxide phase formed thereon.

5. The method recited in claim 1 wherein the desired metal oxide phase is formed at least partially only in a subregion of the precursor alloy layer by means of the thermal pulses, and then, for further crystallization of the precursor alloy layer, further comprising performing a heat treatment of the entire coated substrate.

6. The method recited in claim 1, wherein the thermal pulses are generated during the deposition process of the precursor alloy layer.

7. The method recited in claim 1, further comprising evaporation the separate metallic components of the system with a laser and RF energy while at least one of oxygen is supplied as a gas and an ion stream is provided as the deposition process.

8. The method recited in claim 1, further comprising evaporation the separate metallic components by means of suitable electron beam sources, while at least one of oxygen is supplied as a gas and an ion stream is provided as the deposition process.

9. The method recited in claim 1, wherein a CVD process is provided for the deposition of the components of the system.

10. The method recited in claim 1, wherein the layer is prepared from a superconducting material on the basis of the material system Me1—Me2—Cu—0, where the component Me1 comprises a rare earth metal or yttrium and the component Me2 comprises an earth alkali metal.

11. The method recited in claim 3, further comprising providing an optically transparent substrate and irradiating the substrate from a free rear side thereof which is not coated with the precursor alloy layer.

12. The method recited in claim 3, wherein an optically transparent layer is applied to an optically not transparent substrate and irradiation of the layer takes place from a free surface of the substrate.

13. The method recited in claim 4, wherein one of a monocrystalline $SrTiO_3$ (Sr, Ba) $TiO_3$ substrate is provided.

14. The method recited in claim 5, wherein the subsequent heat treatment is carried out at a temperature of between about 500° C. and 700° C.

15. The method recited in claim 10, wherein the first metallic component Me1 is substituted partially by another metal from the group of metals provided for this component.

16. The method recited in claim 10, wherein the second metallic component Me2 is substituted partially by another metal from the group of metals provided for this component.

17. The method recited in claim 10, wherein the copper or the oxygen of the system is substituted partially by F.

18. The method recited in claim 10, wherein a metal-oxide superconductor material of the material system Y—Ba—Cu-13 O with an orthorhombic crystal structure is produced.

19. The method recited in claim 11, wherein the free surface of the precursor alloy layer is thermally coupled to a cooled surface.

20. The method recited in claim 16, wherein the second metallic component Me2 is substituted partially by another metal from the group of metals provided for this component.

* * * * *